United States Patent [19]

Mitsue et al.

[11] Patent Number: 5,656,864
[45] Date of Patent: Aug. 12, 1997

[54] SEMICONDUCTOR DEVICE HAVING UPPER AND LOWER PACKAGE BODIES AND MANUFACTURING METHOD THEREOF

[75] Inventors: Hiroyuki Mitsue, Kagoshima; Masashi Takenaka; Masao Sakuma, both of Kawasaki, all of Japan

[73] Assignee: Fujitsu Limited, Kawasaki, Japan

[21] Appl. No.: 602,269

[22] Filed: Feb. 16, 1996

Related U.S. Application Data

[63] Continuation of Ser. No. 257,033, Jun. 8, 1994, abandoned.

[30] Foreign Application Priority Data

Sep. 9, 1993 [JP] Japan ................... 5-224802

[51] Int. Cl.[6] ............ H01L 23/12; H01L 23/04; H01L 23/28
[52] U.S. Cl. ............ 257/787; 257/704; 257/730; 257/796
[58] Field of Search .................. 257/787, 704, 257/730, 693, 674, 708, 796, 667, 670, 675

[56] References Cited

U.S. PATENT DOCUMENTS

| | | | |
|---|---|---|---|
| 3,585,272 | 6/1971 | Shatz | 257/704 |
| 5,223,739 | 6/1993 | Katsumata et al. | 257/787 |
| 5,378,924 | 1/1995 | Liang | 257/675 |

FOREIGN PATENT DOCUMENTS

| | | | |
|---|---|---|---|
| 56-04255 | 1/1981 | Japan | 257/787 |
| 56-4255 | 1/1981 | Japan | 257/787 |
| 2049455 | 2/1990 | Japan | 257/676 |
| 3101256 | 4/1991 | Japan | 257/675 |
| 4-129253 | 4/1992 | Japan | 257/787 |
| 5211274 | 8/1993 | Japan | 257/668 |

*Primary Examiner*—Mahshid D. Saadat
*Assistant Examiner*—Jhihan B. Clark
*Attorney, Agent, or Firm*—Staas & Halsey

[57] ABSTRACT

A semiconductor device in which molding resin is not adhered on test pads of leads extending from a junction of an upper package half-body and a lower package half-body. The semiconductor device can effectively release heat generated by a semiconductor chip molded in a package of the semiconductor device. The semiconductor device includes a semiconductor chip having a plurality of leads connected thereto. A package of the semiconductor device is formed by means of molding. The package is constructed of a first package portion and a second package portion integrally formed into one package. The first package portion has a horizontal section smaller than that of the second package portion so that a portion of each of the leads extends from a part of the package between the first package portion and the second package portion and is exposed on a surface of the second package portion. The semiconductor chip is positioned within the second package portion. A supporting member is provided in the second package portion for supporting the portion of each of the leads and is located inside the second package portion so as to prevent deformation of the leads during molding of the package.

9 Claims, 7 Drawing Sheets

SEMICONDUCTOR DEVICE HAVING UPPER AND LOWER PACKAGE BODIES AND MANUFACTURING METHOD THEREOF

This application is a continuation of application Ser. No. 08/257,033, filed Jun. 8, 1994, now abandoned

BACKGROUND OF THE INVENTION

1. Field of the Invention

The present invention generally relates to semiconductor devices, and more particularly to a semiconductor device and a manufacturing method thereof. The semiconductor device has upper and lower package half-bodies which have different dimensions from each other, and leads extending from positions between the upper and lower package half bodies so that inspection can be performed using the exposed portions of the leads.

2. Description of the Related Art

Recently, semiconductor devices have become highly integrated, and thus the semiconductor devices are provided with a large number of pins which extend from a package thereof within a narrow space. Accordingly, the pins have become smaller in width as well as thickness, and thus the strength of those leads has tended to decrease.

Semiconductor devices are subject to a burn-in test, which is a kind of screening test, before they are delivered from a manufacturing plant so as to reduce the possibility of malfunctioning after they are delivered. When performing the burn-in test, a probe is placed in contact with each lead of the semiconductor devices. If the leads touched by the probe do not have enough strength, the leads may be damaged or broken. In order to eliminate this problem, there has been developed a semiconductor device having an upper package half-body and a lower package half-body which have different dimensions from each other, and leads extending from positions between the upper and lower package half-bodies so that inspection can be performed using exposed portions of the leads. In such a semiconductor device, the exposed portions of the leads must be completely bare so that the probe of the test instrument can make complete contact with the leads during the burn-in test.

FIG. 1 is a cross sectional view of a conventional semiconductor device having an upper package half-body and a lower package half-body having different sizes from each other. The semiconductor device 1 shown in FIG. 1 comprises a semiconductor chip 2, leads 4 and a resin package 6.

The semiconductor chip 2 is connected to the leads 4, via gold bumps 5, formed on a TAB (Tape Automated Bonding) tape 3. The semiconductor chip 2 is molded in the resin package 6. The resin package 6 comprises an upper package half-body 6a and a lower package half-body 6b which are integrally formed by molding. A horizontal section of the upper package half-body 6a is smaller than that of the lower package half-body. Accordingly, a stage 7 is formed on a surface of the lower package half-body 6b, on which surface the upper package half-body 6b is formed.

The leads 4 extend outside the package 6 from portions located at a junction of the upper package half-body 6a and the lower package half-body 6b. Accordingly a surface of a portion 4a (herein after referred to as a test pad 4a) of each of the leads 4 is exposed to outside, which portion runs along the stage 7. When performing a burn-in on the semiconductor device 1, the test pad 4a of each of the leads 4 is touched by a probe of a test instrument. Since the test pad 4a is supported and fixed on a stage 7 of the lower surface 6b, the leads 4 (test pads 4a) are not damaged or broken even if pitches between the leads 4 are minimized.

The above-mentioned semiconductor device 1 is formed in the manner described below. FIG. 2 is an illustration for explaining a process for molding the semiconductor device 1. The package 6 of the semiconductor device 1 is formed by molding using a molding die 8.

The molding die 8 comprises an upper die 8a and a lower die 8b. The upper die has a cavity 9a corresponding to the upper package half-body 6a. The lower die 8b has a cavity 9b corresponding to the lower package half-body 6b.

When a molding is performed, the TAB tape 3 is sandwiched between the upper mold 8a and the lower mold 8b with the semiconductor chip 2 located in the center of the cavity 9b. The semiconductor chip 2 is supported only by the leads 4 formed on the TAB tape 3.

A molding resin is then injected into the cavities 9a and 9b through a gate 10. At this time, since the semiconductor chip 2 is supported by the thin and flexible TAB tape 3 and the thin leads 4, the semiconductor chip 2 is displaced by a force exerted on the semiconductor chip 2 due to flow of the resin injected into the cavities 9a and 9b. Accordingly, the TAB tape 3 and the leads 4 are bent as illustrated by dashed lines in FIG. 2.

If the TAB tape 3 and the leads 4 are bent, a small gap is formed between the test pads 4a and a surface of the upper die 8a, and the molding resin may flow into the gap. In such a case, a thin film 6c of the molding resin remains on the surface of the test pads 4a as shown in FIG. 1. Accordingly, there is a problem in that a burn-in test cannot be performed because the probe of the test instrument cannot directly touch the test pads 4a to make an electrical connection.

SUMMARY OF THE INVENTION

It is a general object of the present invention to provide an improved and useful semiconductor device and manufacturing method thereof, in which the above-mentioned problem is eliminated.

A more specific object of the present invention is to provide a semiconductor device and a manufacturing method thereof which can prevent the molding resin from adhering onto test pads of leads extending from a junction of an upper package half-body and a lower package half-body of the semiconductor device.

Another object of the present invention is to provide a semiconductor device which can effectively release heat generated by a semiconductor chip molded in a package of the semiconductor device.

In order to achieve the above-mentioned objects, there is provided according to one aspect of the present invention a semiconductor device comprising:

a semiconductor chip;

a plurality of leads connected to the semiconductor chip;

a package, formed by means of molding, comprising a first package portion and a second package portion integrally formed into one package, the first package having a horizontal section smaller than that of the second package so that a portion of each of the leads extends from a part of the package between the first package portion and the second package portion and is exposed on a surface of the second package, portion the semiconductor chip being positioned within the package; and a supporting member, provided in the second package, portion for supporting the portion of each of the leads from inside the second package so as to prevent deformation of the leads during a process of molding the package.

There is provided according to another aspect of the present invention a method of manufacturing a semiconductor device comprising a semiconductor chip; a plurality of leads connected to the semiconductor chip; and a package, formed by means of molding, comprising a first package portion and a second package portion integrally formed into one package portion, the first package having a horizontal section smaller than that of the second package portion so that a portion of each of the leads extends from a portion between the first package portion and the second package portion and is exposed on a surface of the second package portion, the semiconductor chip being positioned within the package, the manufacturing method comprising the steps of:

(a) connecting the leads to the semiconductor chip;

(b) placing a hollow cup-shaped supporting member, which supports each of the leads, inside a cavity formed in a lower molding die which forms the second package;

(c) placing the leads on the lower molding die so that the semiconductor chip is positioned substantially in the center of the supporting member without making contact with the supporting member;

(d) placing an upper molding die having a cavity provided for forming the first package so that the leads are sandwiched between the upper molding die and the lower molding die; and (e) injecting molding resin into the cavities of the upper molding die and the lower molding die.

According to the present invention, the leads are supported by the supporting member during a molding process. Accordingly, the leads are not bent or deformed by a force due to flow of the molding resin, and thus the molding resin cannot enter between the leads and the upper die. Additionally, the supporting member serves to effectively transfer heat generated by the semiconductor chip to outside the package.

Other objects, features and advantages of the present invention will become more apparent from the following detailed description when read in conjunction with the accompanying drawings.

DETAILED DESCRIPTION OF THE PREFERRED EMBODIMENTS

Figure 3:
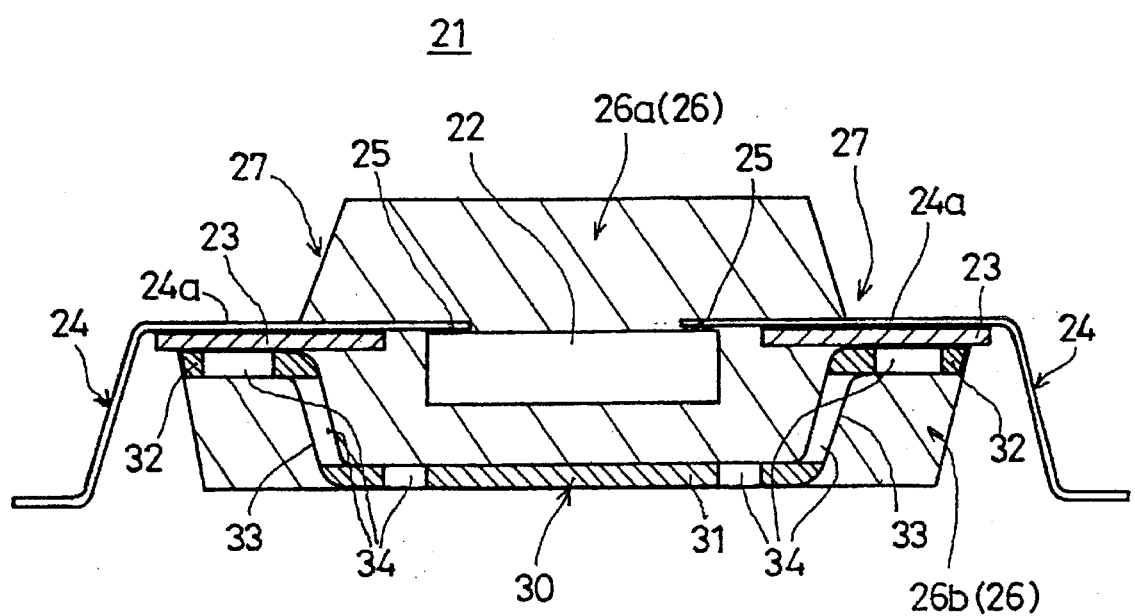
FIG. 3 is a cross sectional view of a first embodiment of a semiconductor device according to the present invention.

A description will now be given, with reference to FIG. 3, of a first embodiment according to the present invention. FIG. 3 is a cross sectional view of a semiconductor device 21 which is the first embodiment according to the present invention. As shown in FIG. 3, a semiconductor chip 22 is connected to leads 24, formed on a TAB tape 23, via gold bumps 25.

The semiconductor device 22 is a highly integrated circuit device, and many electrodes are formed on an upper surface thereof. The TAB tape 23 is formed of a base film which is made of resin such as polyimide. The leads 24 are made of metal having a high electrical conductivity. A position of each of the leads on the TAB tape corresponds to a respective electrode formed on the upper surface off the semiconductor chip 22.

Because the semiconductor device 21 is highly integrated, pitches of the leads 24 are narrow, and thus the leads 24 do not have high strength. Additionally, the thickness of the base film of the TAB tape 23 is relatively small due to miniaturization of the semiconductor device 21 and formability of a resin package of the semiconductor device 21. Accordingly the TAB tape 23 is flexible, and is easily bent by a small external force.

In order to connect the semiconductor chip to the leads 24, gold bumps are formed first on the electrodes on the upper surface of the semiconductor chip 22. Each of the gold bumps 25 is fused by heat after the respective one of the leads 24 formed on The TAB tape 23 is positioned on the gold bump 25 so that the electrodes are connected to the respective leads 24. After the semiconductor chip 22 is connected to the leads, the semiconductor chip 22, the inner portion of the lead 23 are molded with resin so as to seal the semiconductor chip 23 within a resin package 26.

The resin package 26 comprises an upper package half-body 26a and a lower package half-body 26b which are integrally formed into a single package by molding. A horizontal section of the upper package half-body 26a is smaller than that of the lower package half-body 26b. Accordingly, a stage 27 is formed on a portion of the upper surface of the lower package half-body 26b beyond the area where the upper package half-body 6b extends. Accordingly, the leads 24 extend outside the package 26 from portions located at the junction of the upper package half-body 26a and the lower package half-body 26b and run along the stage 27. The portions of the leads extending along the stage 27 constitute test pads 24a.

Additionally, a supporting member 30, which is an essential part of the present invention, is incorporated into the lower package half-body 26b. The supporting member 30 is made of a material having an insulating property and a high heat conductivity, such as an anodized aluminum alloy.

Figure 4A:
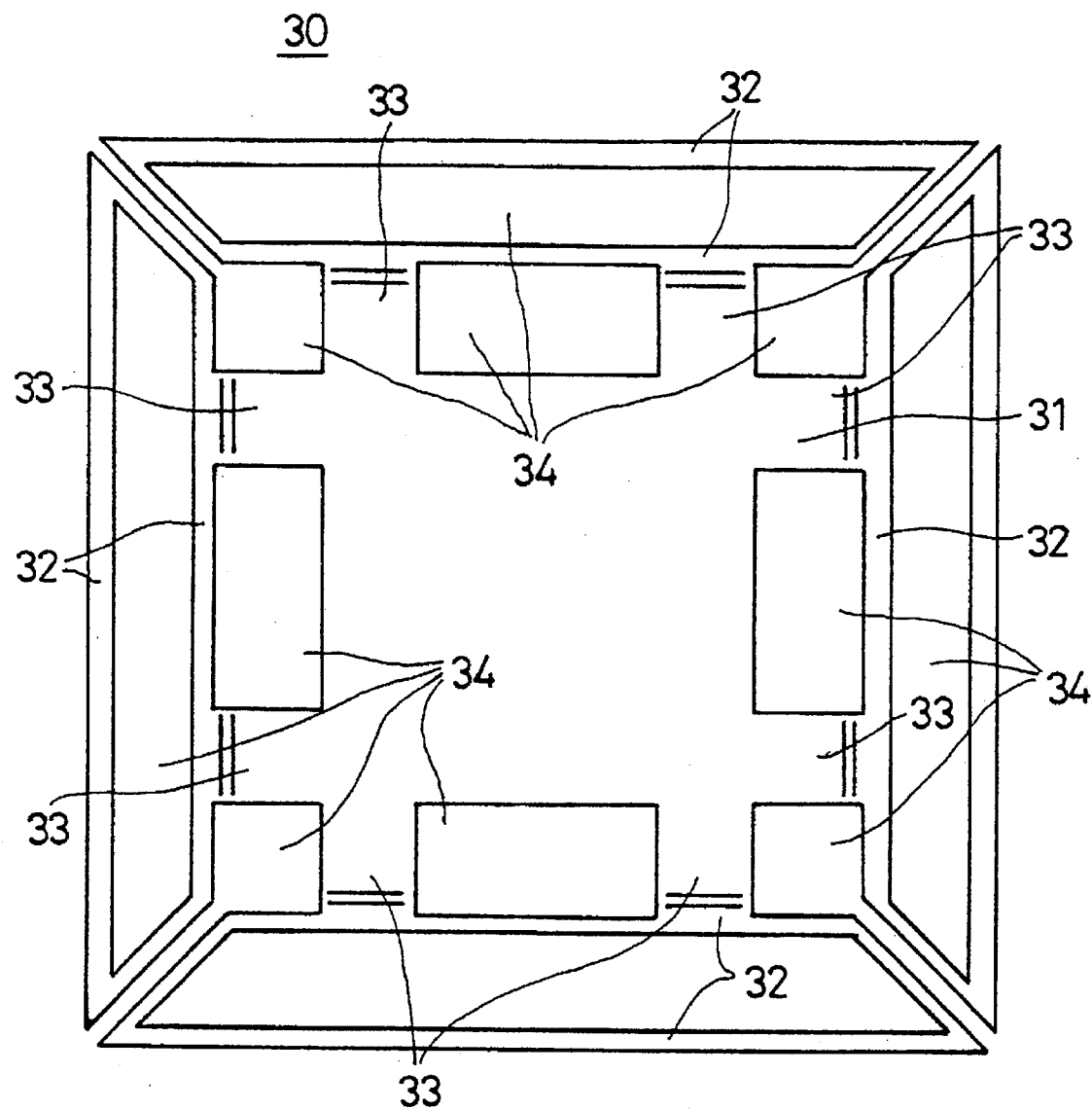
FIG. 4A is an enlarged plan view of the supporting member shown in FIG. 3.
Figure 4B:
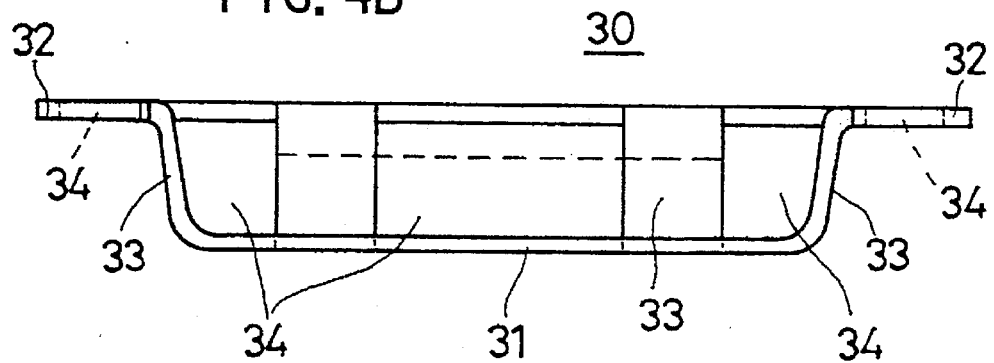
FIG. 4B, is a side view of the supporting member shown in FIG. 4A.

FIGS. 4A and 4B show the supporting member 30. The supporting member 30 is formed in a square-cup shape, as shown in FIG. 3 and FIGS. 4A and 4B, having a bottom section 31, supporting sections 32 and column sections 33. A plurality of through holes 34 are formed on the bottom section 31, the supporting sections 32 and the column sections 33. The supporting member 30 can be formed of an aluminum alloy plate by means of press forming, and thus manufacturing of the supporting member 30 is easy and inexpensive.

The supporting member 30 is insert molded within the package 26. The bottom section 31 is located on a lower surface of the lower package half-body 26b, and surface of the bottom section may be exposed on the lower surface of the lower package half-body 26b. The supporting sections 32 of the supporting member 30 are made in contact with a lower surface of the TAB tape 23 so as to support the TAB tape 23 and the leads 24.

It should be noted that since the supporting member 30 is formed in a hollow cup shape, the semiconductor chip 22 can be positioned inside the supporting member 30 without interference. Additionally, by applying a black-anodization to the supporting member 30 made of an aluminum plate, good appearance may be maintained even if the bottom section of the supporting member 30 is exposed on the surface of the lower package half-body 26b which is made of resin which usually colored black.

The supporting member 30 can also serve as a heat transfer member because the supporting member is made of a material such an aluminum alloy having a good heat conductivity as compared with the molding resin forming the package 26. Heat generated by the semiconductor chip 22 is transferred through the supporting member 30 rather than the resin, and efficiently released from the package 26 (the bottom section 31) to outside.

Figure 1:
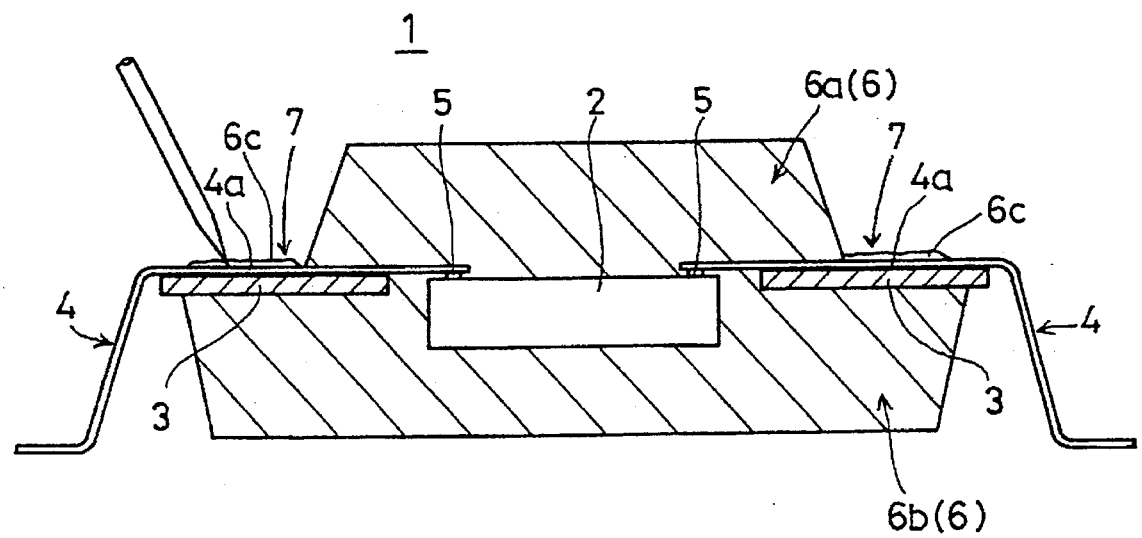
FIG. 1 is a cross sectional view of a conventional semiconductor device having an upper package half-body and a lower package half-body having different sizes from each other.
Figure 2:
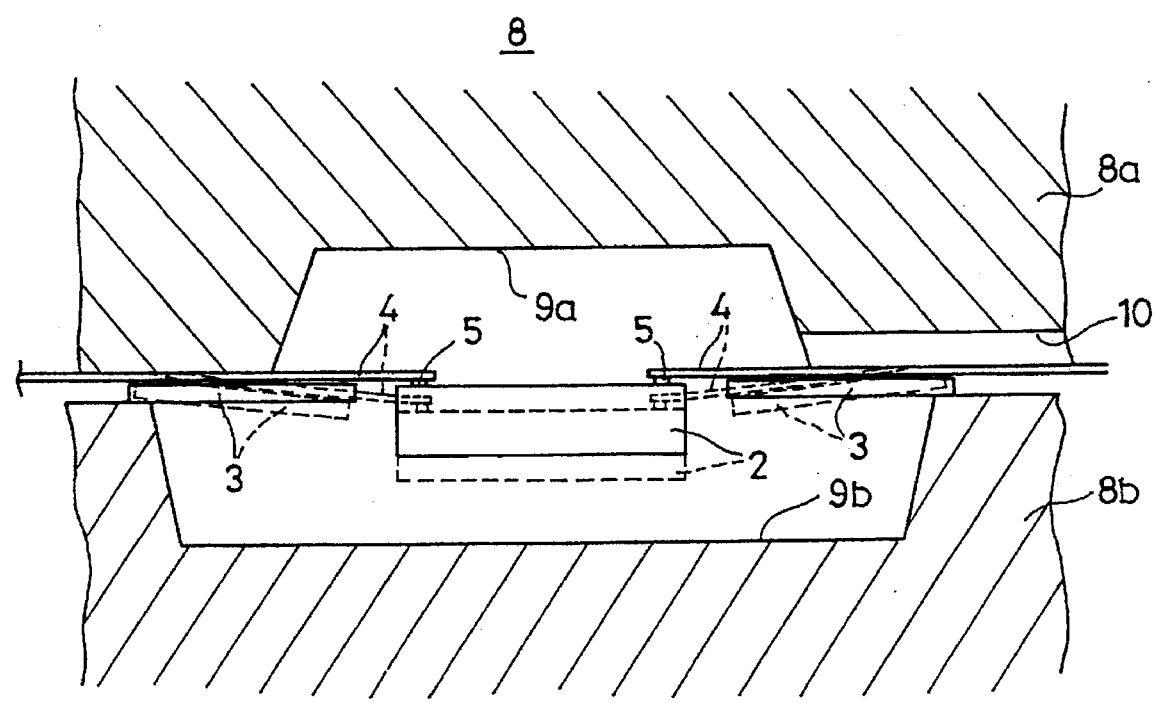
FIG. 2 is an illustration explaining a process for molding the semiconductor device 1 shown in FIG. 1.
Figure 5:
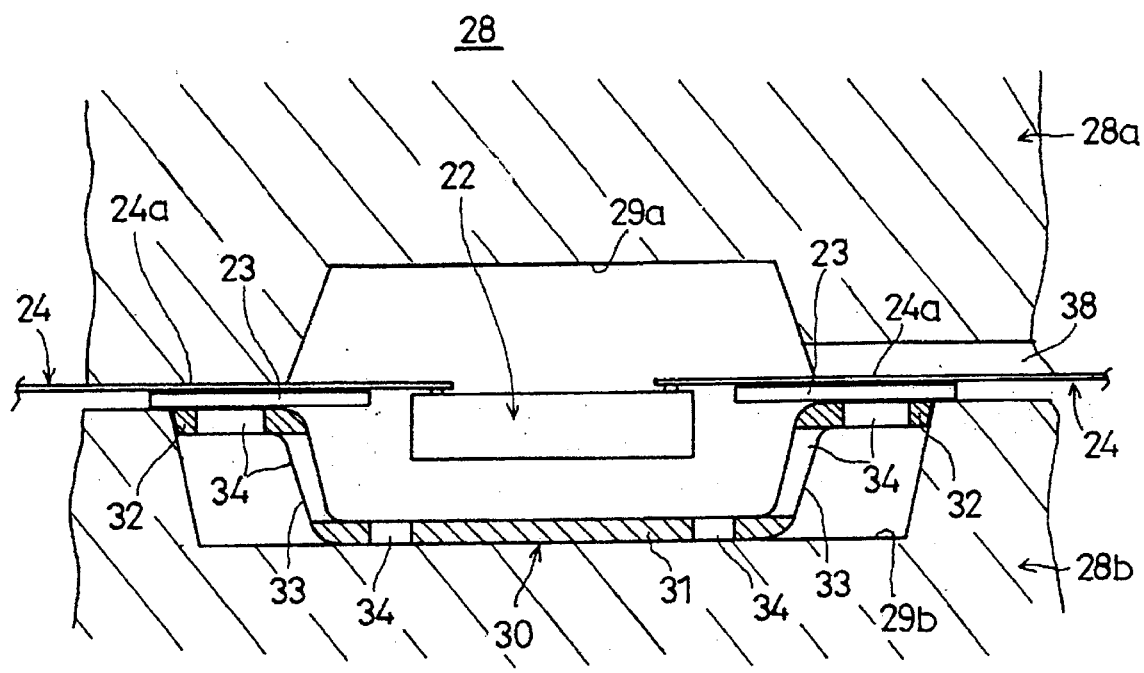
FIG. 5 is an illustration explaining a molding process of the semiconductor device shown in FIG. 3.

The resin package 26 is formed, as shown in FIG. 5, using a molding die 28. The molding die 28 comprises an upper die 28a and a lower die 28b. The upper die 28a has a cavity 29a corresponding to the upper package half-body 26a, and the lower die 28b has a cavity 29b corresponding to the lower package half-body 26b. The molding die 28 is the same as the molding die 8 shown in FIG. 2 which is used for molding the conventional semiconductor device. Therefore, there is no need to change the molding die when manufacturing the semiconductor device 21 according to the present invention, and thus an increase in manufacturing cost for the semiconductor device 21 can be reduced.

When performing a molding operation of the package 26, first the supporting member 30 is placed inside the cavity 29b of the lower die 28b. Forming of a positioning recess on a bottom surface of the cavity 29b may facilitate an accurate positioning of the supporting member 30. In such a structure, the lower surface of the bottom section 31 of the supporting member 30 is exposed on the surface of the lower package half-body 26b, and thus releasing of heat from the lower package half-body 26b can be improved.

After the supporting member 30 has been placed inside the cavity 29b, the TAB tape 23 on which the leads supporting semiconductor chip 22 are mounted is placed between the upper die 28a and the lower die 28b so that the semiconductor chip 22 is positioned in the center of the cavity 29b. The molding die is then closed to sandwich a portion of the TAB tape 23. In this state, the supporting sections 32 of the supporting member 30 abut the TAB tape 30 to support a portion of the TAB tape 23, on which portion the test pads 24a of the leads 24 are located.

After the molding die 28 is closed, a molding resin is injected into the cavities 29a and 29b via a gate 38. Unlike the above-mentioned conventional semiconductor device, since there is the supporting member 30 supporting the TAB tape 23, the TAB tape 23 is not allowed to be bent or deformed by a force exerted on the TAB tape 23 and the semiconductor chip 22 due to flow of the molding resin. Accordingly, the semiconductor chip 22 is maintained at a predetermined position where the TAB tape 23 and the leads 24 extend straight, and thus there is no gap formed between the upper die 28a and the leads 24. This condition prevents the forming of remaining molding resin on the test pads 24a of the leads 24 of the molded complete package 26.

Since a plurality of through holes 34 are formed in the supporting member 30, the molding resin injected into the cavity 29b flows to the entire cavity 29b through the through holes 34. Accordingly, it is not necessary to increase the injection pressure of the molding resin.

When the burn-in test is performed in the semiconductor device 21 formed in the above-mentioned manner, a probe of a test instrument is pressed onto the test pads 24a so as to obtain a good electrical conductivity between the probe and the test pads 24a. At this time, since no resin has remained on the test pads 24a, good conductivity is easily obtained with a small pressing force of the probe. Additionally, since the test pads 24a are supported by the supporting member 30 incorporated into the lower package half-body 26a, the test pads 24a (leads 24) are not bent or deformed even if a large force is applied to the test pads 24, and thus the burn-in test can be conducted with high accuracy.

Figure 6:
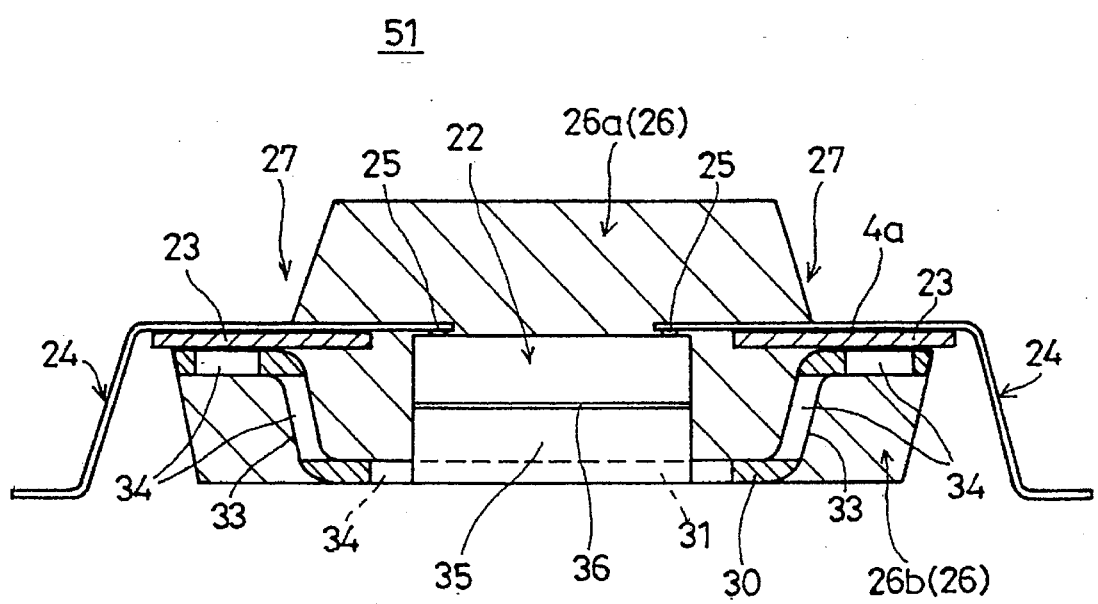
FIG. 6 is a cross sectional view of a second embodiment of a semiconductor device according to the present invention.

A description will now be given, with reference to FIG. 6, of a second embodiment of according to the present invention. FIG. 6 shows a semiconductor device 51 which is the second embodiment according to the present invention. In FIG. 6, parts the same as the parts shown in FIG. 3 are given the same reference numerals, and descriptions thereof will be omitted.

The supporting member 30 incorporated in the semiconductor device 51 has a contacting section 35 formed on the bottom section 31. The contacting section 35 protrudes from the bottom section 31 towards the semiconductor chip 22 so that the semiconductor chip 22 can be placed on the contacting section 35 when the supporting member 30 and the TAB tape 23 are positioned in the molding die 28. That is, the semiconductor chip 22 is made to directly contact the contacting section 35 of the supporting member 30.

In this construction, heat generated by the semiconductor chip can be directly transferred to the supporting member 30 which has a high heat conductivity, and thus undesired heat can be efficiently eliminated from the semiconductor chip 22 as compared to the construction of the above-mentioned first embodiment according to the present invention. A paste layer 36 comprised of a thermo-plastic material having an electrical insulating function and high heat conductivity may be provided between the semiconductor chip 22 and the contacting section 35 so as to improve heat transfer efficiency.

It should be noted that the contacting section 35 can be formed in the same process in which the supporting member 30 is formed by means of press forming. Accordingly, there is no additional manufacturing cost in forming the contacting section 35.

Figure 7:
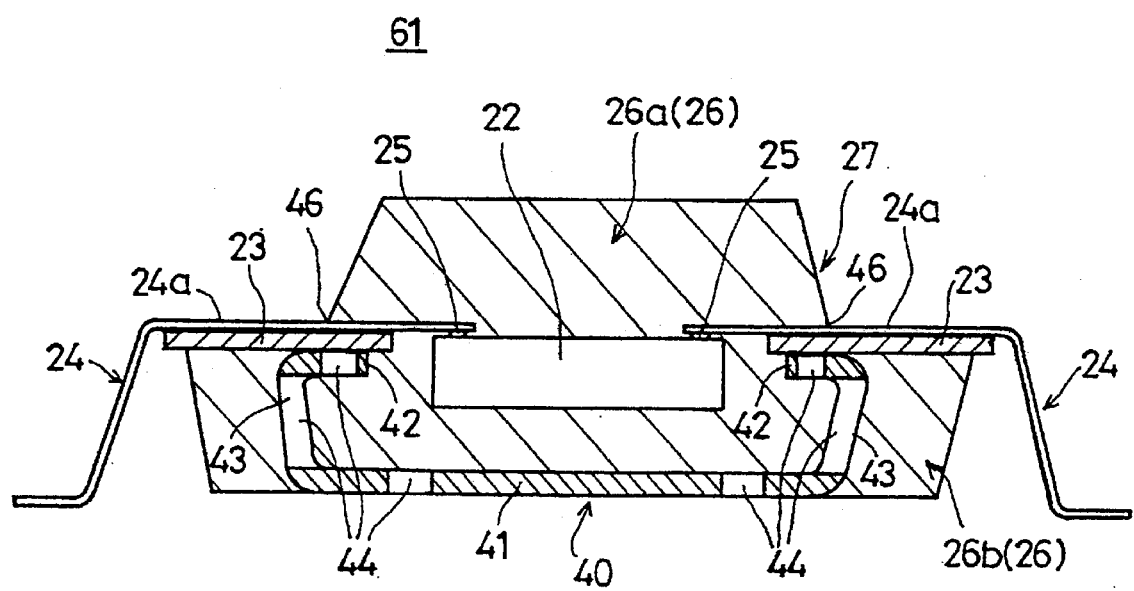
FIG. 7 is a cross sectional view of a third embodiment of a semiconductor device according to the present invention.

A description will now be given, with reference to FIG. 7, of a third embodiment according to the present invention. FIG. 7 shows a semiconductor device 61 which is the third embodiment according to the present invention. In FIG. 7, parts the same as the parts shown in FIG. 3 are given the same reference numerals, and descriptions thereof will be omitted.

Figure 8A:
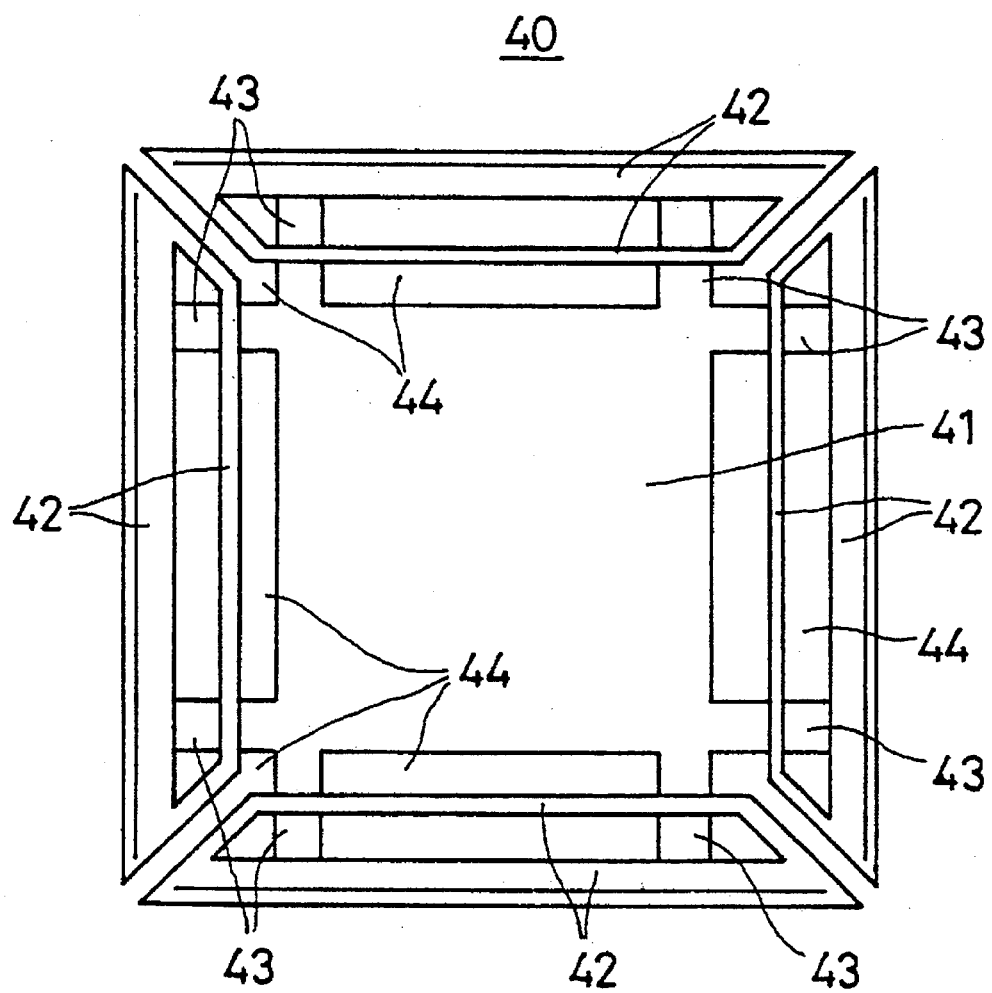
FIG. 8A is an enlarged plan view of the supporting member shown in FIG. 7.
Figure 8B:
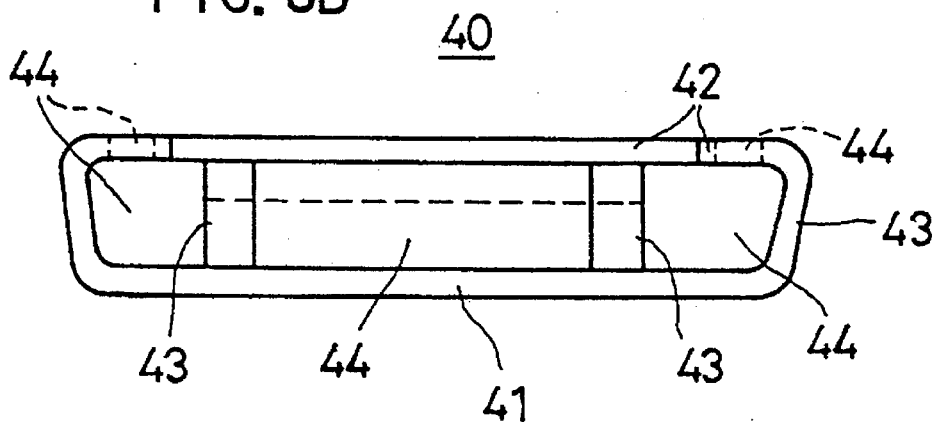
FIG. 8B is a side view of the supporting member shown in FIG. 8A.

The semiconductor device 61 has a supporting member 40 instead of the supporting member 30 of the semiconductor device 21 shown in FIG. 3. The supporting member 40 has basically the same construction as the supporting member 30 except that supporting sections 42 are bent inwardly. Other sections such as bottom section 41 and column sections 43 and through holes 44 are the same as those of the supporting member 30. It should be noted that details of the supporting member are shown in FIGS. 8A and 8B.

In the embodiment of FIG. 7 the supporting sections 42 can be positioned directly under a parting line or junction 46 of the package 26. This ensures support of the TAB tape 23 directly under the parting line 46, and thus ensures prevention of leakage of the molding resin from the parting line 46. Additionally, because the supporting sections 42 are bent inward, the ends of the supporting sections are positioned closer to the semiconductor chip 22, resulting in more efficient heat transfer of the heat generated by the semiconductor device 22.

Figure 9:
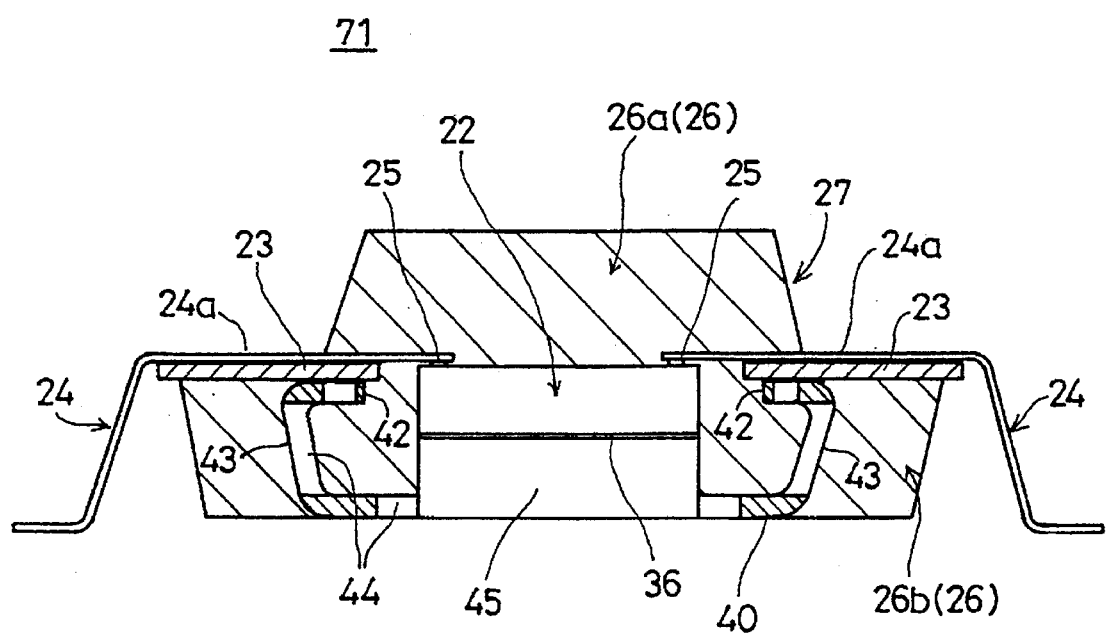
FIG. 9 is a cross sectional view of a fourth embodiment of a semiconductor device according to the present invention.

A description will now be given, with reference to FIG. 9, of a fourth embodiment according to the present invention. FIG. 9 shows a semiconductor device 71 which is the fourth embodiment according to the present invention. In FIG. 9, parts the same as the parts shown in FIG. 7 are given the same reference numerals, and descriptions thereof will be omitted.

The supporting member 40 incorporated in the semiconductor device 71 has a contacting section 45 formed on the bottom section 31. The contacting section 45 protrudes from the bottom section 41 towards the semiconductor chip 22 so that the semiconductor chip 22 can be placed on the contacting section 45 when the supporting member 40 and the TAB tape 23 are positioned in the molding die 28. That is, the semiconductor chip 22 is directly in contact with the contacting section 45 of the supporting member 40.

In this construction, heat generated by the semiconductor chip 22 can be directly transferred to the supporting member 40 which has a high heat conductivity, and thus undesired heat can be efficiently eliminated from the semiconductor chip 22 as compared to the construction of the above-mentioned first embodiment according to the present invention. Similarly to the semiconductor device shown in FIG. 6, the thermo-plastic paste layer 36 having an electrical insulating function may be provided between the semiconductor chip 22 and the contacting section 45 so as to improve heat transfer efficiency.

It should be noted that the contacting section 45 can be formed in the same process by which the supporting member 40 is formed by means of press forming. Accordingly, there is no additional manufacturing cost in forming the contacting section 45.

Although, in the above-mentioned embodiment, of FIG. 9 the upper package half-body 26a is smaller than the lower package half-body, the lower package half-body 26b may be smaller than the upper package half-body 26a. In such a case, the supporting element 30 or 40 and the semiconductor chip 22 must be positioned within the upper package half-body 26a.

The present invention is not limited to the specifically disclosed embodiment, and variations and modifications may be made without departing from the scope of the present invention.

What is claimed is:

1. A semiconductor device comprising:

a semiconductor chip;

a plurality of leads connected to said semiconductor chip;

a package comprising a first package portion and a second package portion integrally formed into one package by molding a molding material, said first package portion having a horizontal section smaller than that of said second package portion so that a portion of each of said leads extends from a part of said package between said first package portion and said second package portion and said portion of each of said leads is exposed on a surface of said second package portion, said semiconductor chip being positioned within said package; and supporting means, provided in said second package portion, for supporting said portion of each of said leads from inside said second package so as to prevent deformation of said leads during molding of said package, a part of said supporting means being completely embedded in said second package portion, said semiconductor chip being positioned substantially in the center of said second package portion without making contact with said supporting means.

2. A semiconductor device comprising:

a semiconductor chip;

a plurality of leads connected to said semiconductor chip;

a package comprising a first package portion and a second package portion integrally formed into one package by molding a molding material, said first package portion having a horizontal section smaller than that of said second package portion so that a portion of each of said leads extends from a part of said package between said first package portion and said second package portion and said portion of each of said leads is exposed on a surface of said second package portion, said semiconductor chip being positioned within said package; and supporting means, provided in said second package portion, for supporting said portion of each of said leads from inside said second package so as to prevent deformation of said leads during molding of said package, a part of said supporting means being completely embedded in said second package portion so that said molding material of said second package portion is exposed on an exterior side, opposite to said portion of each of said leads, wherein said supporting means comprises a supporting member having a hollow cup-shape and having a bottom section and a supporting section comprising a top portion of said supporting member so that said semiconductor chip is positioned substantially in the center of said second package portion without making contact with said supporting member.

3. The semiconductor device as claimed in claim 2, wherein said supporting section extends in a direction towards the outside of said supporting member and is parallel with said bottom section.

4. The semiconductor device as claimed in claim 2, wherein said supporting section extends in a direction towards the inside of said supporting member and is parallel with said bottom section.

5. The semiconductor device as claimed in claim 2, wherein said supporting member is comprised of an electrically insulating material having high heat conductivity.

6. The semiconductor device as claimed in claim 2, wherein said supporting member has at least one through hole through which a molding resin flows during molding of said package.

7. The semiconductor device as claimed in claim 2, wherein said leads are supported on a TAB tape.

8. The semiconductor device as claimed in claim 5, wherein said supporting member is comprising of an anodized aluminum alloy plate.

9. A semiconductor device comprising:

a semiconductor chip;

a plurality of leads connected to said semiconductor chip;

a package comprising a first package portion and a second package portion integrally formed into one package by molding a molding material, said first package portion having a horizontal section smaller than that of said second package portion so that a portion of each of said leads extends from a part of said package between said first package portion and said second package portion and said portion of each of said leads is exposed on a surface of said second package portion, said semiconductor chip being positioned within said package; and a supporting member, provided in said second package portion, for supporting said portion of each of said leads from inside said second package so as to prevent deformation of said leads during molding of said package, said supporting member having a first part, a second part, and a third part connecting said first part and said second part, said first part being substantially positioned in a plane in which said portion of each of said leads is positioned, said second part being positioned in a plane in which a bottom surface of said second package portion lies, said third part being completely embedded in said second package portion, said semiconductor chip being positioned substantially in the center of said second package portion without making contact with said supporting member.

* * * * *

UNITED STATES PATENT AND TRADEMARK OFFICE
CERTIFICATE OF CORRECTION

PATENT NO. : 5,656,864
DATED : Aug. 12, 1997
INVENTOR(S) : MITSUE et al.

It is certified that error appears in the above-identified patent and that said Letters Patent is hereby corrected as shown below:

TITLE PAGE: Item

[75] Inventors, first line, change "Kagoshima" to --Satsuma--.

[73] Assignee: Correct the assignee information as follows:

Fujitsu Limited, Fujitsu Automation Limited, both
of Kawasaki; and Kyushu Fujitsu Electronics
Limited, Satsuma, all of Japan.

Col. 3, line 10, change "one package portion, the first package" to --one package, the first package portion--;
line 12, change "portion" (second occurrence) to --part of the package--.

Col. 8, line 63 (Claim 8, line 2, change "comprising" to --comprised--.

Signed and Sealed this

Ninth Day of November, 1999

Attest:

Q. TODD DICKINSON

*Attesting Officer*     *Acting Commissioner of Patents and Trademarks*